United States Patent
Haddad et al.

[11] Patent Number: 6,157,572
[45] Date of Patent: Dec. 5, 2000

[54] METHOD FOR ERASING FLASH ELECTRICALLY ERASABLE PROGRAMMABLE READ-ONLY MEMORY (EEPROM)

[75] Inventors: Sameer S. Haddad; Wing H. Leung, both of San Jose; John Chen, Cupertino; Ravi S. Sunkavalli, Santa Clara; Ravi P. Gutala, Milpitas, all of Calif.; Jonathan S. Su, Evanston, Ill.; Vei-Han Chen, San Jose; Colin S. Bill, Cupertino, both of Calif.

[73] Assignee: Advanced Micro Devices, Sunnyvale, Calif.

[21] Appl. No.: 09/085,680

[22] Filed: May 27, 1998

[51] Int. Cl.[7] .................................................. G11C 16/04
[52] U.S. Cl. .................. 365/185.22; 365/185.3; 365/185.33; 365/185.02; 365/185.13; 365/185.23
[58] Field of Search ............................ 365/185.3, 185.33, 365/185.02, 185.13, 185.29, 185.22, 185.23

[56] References Cited

U.S. PATENT DOCUMENTS 5,579,261  11/1996  Radjy et al. ...................... 365/185.33
5,638,324   6/1997  Sim ................................. 365/185.22
5,642,311   6/1997  Cleveland et al. .................. 365/185.3

*Primary Examiner*—Andrew Q. Tran
*Attorney, Agent, or Firm*—Arter & Hadden LLP; David G. Alexander

[57] ABSTRACT

A flash Electrically-Erasable Programmable Read-Only Memory (EEPROM) includes a plurality of floating gate transistor memory cells, a plurality of wordlines connected to the cells and a power supply for generating erase pulses. A controller controls the power supply to apply an erase pulse to all wordlines which are not deselected. Then, an erase verify procedure is applied to the cells in sequence. If all cells connected to a wordline pass the erase verify test, the wordline is deselected such that subsequent erase pulses will not be applied to the wordline and possibly cause the cells to become overerased. In one embodiment of the invention, erase verify is performed on all of the cells after an erase pulse is applied. The erase operation is completed when all cells pass erase verify. In another embodiment, erase verify is applied to each cell in sequence, with erase pulses being applied until each current cell passes erase verify. The wordlines can be deselected individually or in groups. The invention results in a tightening of the threshold voltage distribution of the cells.

20 Claims, 14 Drawing Sheets

ERASE SELECTED

ERASE DESELECTED

PROGRAM SELECTED

PROGRAM DESELECTED

METHOD FOR ERASING FLASH ELECTRICALLY ERASABLE PROGRAMMABLE READ-ONLY MEMORY (EEPROM)

BACKGROUND OF THE INVENTION

1. Field of the Invention

The present invention generally relates to the art of microelectronic integrated circuits, and more specifically to a method for erasing a flash Electrically Erasable Programmable Read-Only Memory (EEPROM).

2. Description of the Related Art

A microelectronic flash or block erase Electrically Erasable Programmable Read-Only Memory (Flash EEPROM) includes an array of cells which can be independently programmed and read. The size of each cell and thereby the memory are made small by omitting select transistors which would enable the cells to be erased independently. All of the cells are erased together as a block.

A memory of this type includes individual Metal-Oxide-Semiconductor (MOS) field effect transistor memory cells, each of which includes a source, drain, floating gate and control gate to which various voltages are applied to program the cell with a binary 1 or 0, or erase all of the cells as a block.

The cells are connected in a rectangular array of rows and columns, with the control gates of the cells in a row being connected to a respective wordline and the drains of the cells in a column being connected to a respective bitline. The sources of the cells are connected together. This arrangement is known as a NOR memory configuration.

A cell is programmed by applying, typically, 9 V to the control gate, 5 V to the drain and grounding the source, which causes hot electrons to be injected from the drain depletion region into the floating gate. Upon removal of the programming voltages, the injected electrons are trapped in the floating gate and create a negative charge therein which increases the threshold voltage of the cell to a value in excess of approximately 4 V.

The cell is read by applying typically 5 V to the control gate, 1 V to the bitline to which the drain is connected, grounding the source, and sensing the bitline current. If the cell is programmed and the threshold voltage is relatively high (4 V), the bitline current will be zero or at least relatively low. If the cell is not programmed or erased, the threshold voltage will be relatively low (2 V), the control gate voltage will enhance the channel, and the bitline current will be relatively high.

A cell can be erased in several ways. In one arrangement, a cell is erased by applying typically 12 V to the source, grounding the control gate and allowing the drain to float. This causes the electrons which were injected into the floating gate during programming to be removed by Fowler-Nordheim tunneling from the floating gate through the thin tunnel oxide layer to the source. Alternatively, a cell can be erased by applying a negative voltage on the order of −10 V to the control gate, applying 5 V to the source and allowing the drain to float.

A problem with the conventional flash EEPROM cell arrangement is that due to manufacturing tolerances, some cells become over-erased before other cells become erased sufficiently. The floating gates of the over-erased cells are depleted of electrons and become positively charged. This causes the overerased cells to function as depletion mode transistors which cannot be turned off by normal operating voltages applied to their control gates, and introduces leakage during subsequent program and read operations.

More specifically, during program and read operations only one wordline which is connected to the control gates of a row of cells is held high at a time, while the other wordlines are grounded. However, a positive voltage is applied to the drains of all of the cells. If the threshold voltage of an unselected cell is zero or negative, leakage current will flow through the source, channel and drain of the cell.

This undesirable effect is illustrated in FIG. 1. The drains of a column of floating gate cell transistors $T_0$ to $T_m$ are connected to a bitline BL, which is itself connected to a bitline driver 1. The sources of the transistors $T_0$ to $T_m$ are typically connected to ground. One of the transistors $T_0$ to $T_m$ is selected for a program or read operation by applying a positive voltage, e.g. 5 V, to its control gate which turns on the transistor. The control gates of the unselected transistors are connected to ground.

As viewed in FIG. 1, 5 V is applied to the transistor $T_1$ which turns it on. A current $I_1$ flows through the transistor $T_1$ from ground through its source, channel (not shown) and drain and through the bitline BL to the driver 1. Ideally, the bitline current $I_{BL}$ should be equal to $I_1$.

However, if one or more of the unselected transistors, e.g. the transistor $T_2$ as illustrated in FIG. 1, is overerased, its threshold voltage will be zero or negative, and background leakage current will flow through the transistor $T_2$ as indicated at $I_2$. The bitline current $I_{BL}$ is now no longer equal to $I_1$, but is equal to the sum of $I_1$ and the background leakage current $I_2$.

In a typical flash EEPROM, the drains of a large number, for example 512, transistor cells such as illustrated in FIG. 1 are connected to each bitline (column). If a substantial number of cells on the bitline are drawing background leakage current, the total leakage current on the bitline can exceed the cell read current. This makes it impossible to read the state of a cell on the bitline and renders the memory inoperative.

FIG. 2 illustrates how the threshold voltages of the cells or bits in a flash EEPROM can differ substantially from each other following an erase operation as shown by a solid line curve which represents the numbers of cells having particular values of threshold voltage $V_T$. It will be seen that the least erased cells will have a relatively high threshold voltage $V_T\text{MAX}$, whereas the most overerased cells will have a low threshold voltage which is below a minimum acceptable value $V_T\text{MIN}$ that can be negative. The characteristic illustrated in FIG. 2 is known as the threshold voltage distribution.

FIG. 3 illustrates how the background leakage current of a cell varies as a function of threshold voltage. The lower (more negative) the threshold voltage, the higher the leakage current. It is therefore desirable to prevent cells from being overerased and reduce the threshold voltage distribution to as low a range as possible, with ideally all cells having the same high threshold voltage after erase on the order of 2 V.

It is known in the art to reduce the threshold voltage distribution by performing an overerase correction operation which reprograms the most overerased cells to a higher threshold voltage. This operation will result in the threshold voltage curve being altered to the shape indicated by broken line in FIG. 2 in which the threshold voltages of all of the cells are above the minimum acceptable value $V_T\text{MIN}$. An overerase correction operation of this type is generally known as Automatic Programming Disturb (APD).

A preferred APD method which is referred to as Automatic Programming Disturb Erase (APDE) is disclosed in U.S. Pat. No. 5,642,311, entitled "OVERERASE CORRECTION FOR FLASH MEMORY WHICH LIMITS OVERERASE AND PREVENTS ERASE VERIFY ERRORS", issued Jun. 24, 1997 to Lee Cleveland. This patent is assigned to the same assignee as the present invention and is incorporated herein by reference in its entirety. The method includes sensing for overerased cells and applying programming pulses thereto which bring their threshold voltages back up to acceptable values.

Following application of an erase pulse, undererase correction is first performed on a cell-by cell basis by rows. The cell in the first row and column position is addressed and erase verified by applying 4 V to the control gate (wordline), 1 V to the drain (bitline), grounding the source, and using sense amplifiers to sense the bitline current and thereby determine if the threshold voltage of the cell is above a value of, for example, 2 V. If the cell is undererased (threshold voltage above 2 V), the bitline current will be low. In this case, an erase pulse is applied to all of the cells, and the first cell is erase verified again.

After application of each erase pulse and prior to a subsequent erase verify operation, overerase correction is performed on all of the cells of the memory. Overerase verify is performed on the bitlines of the array in sequence. This is accomplished by grounding the wordlines, applying typically 1 V to address the first bitline, and sensing the bitline current. If the current is above a predetermined value, this indicates that at least one of the cells connected to the bitline is overerased and is drawing leakage current. In this case, an overerase correction pulse is applied to the bitline. This is accomplished by applying approximately 5 V to the bitline for a predetermined length of time such as 100 μs.

After application of the overerase correction pulse the bitline is verified again. If bitline current is still high indicating that an overerased cell still remains connected to the bitline, another overerase correction pulse is applied. This procedure is repeated for all of the bitlines in sequence.

The procedure is repeated as many times as necessary until the bitline current is reduced to the predetermined value which is lower than the read current. Then, the procedure is performed for the rest of the cells in the first row and following rows until all of the cells in the memory have been erase verified.

By performing the overerase correction procedure after each erase pulse, the extent to which cells are overerased is reduced, improving the endurance of cells. Further, because overerased cells are corrected after each erase pulse, bitline leakage current is reduced during erase verify, thus preventing undererased cells from existing upon completion of the erase verify procedure.

Although the APDE method is effective in eliminating overerased cells, it is limited in that since the sources and wordlines (control gates) of the cells are grounded during overerase correction, overerased cells will draw background leakage current while the overerase correction pulses are being applied. The leakage current requires the provision of a large power supply. In addition, background leakage current is also present during programming and creates similar problems.

These problems are exacerbated as the supply voltage $V_{cc}$ is reduced in step with the reduction of feature sizes of EEPROMs. The threshold voltages of the erased cells must be reduced to accommodate the lower values of $V_{cc}$. This results in more cells in the low threshold voltage portion of the curve in FIG. 2 drawing leakage current.

In a sufficiently low $V_{CC}$ application, so many cells will draw leakage current that the total bitline leakage current during erase verify can exceed the value corresponding to an erased cell, even if the cell being verified is undererased. This makes it impossible to determine the state of a cell during erase verify and read, and renders the memory inoperative. This problem has remained unsolved in the prior art and has severely hindered the development of reduced voltage EEPROMs.

Another undesirable effect which becomes especially problematic at low values of $V_{cc}$ is that if $V_{cc}$ is applied directly to a wordline, it will be insufficient to enhance the channel of a selected cell such that a verify operation can be performed during erase. For this reason, a booster is provided to boost the wordline voltage to a value which is sufficiently higher than $V_{cc}$ that cell verification can be reliably performed. For a value of $V_{cc}$=3 V, the wordline voltage is typically boosted to a value of approximately 4–5 V.

Voltages are applied to bitlines through pass transistors which enable individual bitline selection. The background leakage current loads down the charge pump and increases the voltage drop across the pass transistors, resulting in a lower drain voltage being applied to the cells. If the drain voltage becomes too low, which can result from excessive leakage current, the cell operation can become unstable and unreliable.

SUMMARY OF THE INVENTION

It is an object of the present invention to provide a method for operating a flash Electrically-Erasable Programmable Read-Only Memory (EEPROM) which overcomes the above described limitations of the prior art.

More specifically, a flash Electrically-Erasable Programmable Read-Only Memory (EEPROM) includes a plurality of floating gate transistor memory cells, a plurality of wordlines connected to the cells and a power supply for generating erase pulses.

A controller controls the power supply to apply an erase pulse to all wordlines that are not deselected. Then, an erase verify procedure is applied to the cells in sequence. If all cells connected to a wordline pass the erase verify test, the wordline is deselected such that subsequent erase pulses will not be applied to the wordline and possibly cause the cells to become overerased.

In one embodiment of the invention, erase verify is performed on all of the cells after an erase pulse is applied. The erase operation is completed when all cells pass erase verify. In another embodiment, erase verify is applied to each cell in sequence, with erase pulses being applied until each current cell passes erase verify. The wordlines can be deselected individually or in groups.

The present invention substantially reduces the number of times that erase pulses are applied to cells that are already erased or overerased. This reduces the stress on the cells, increases their endurance, and also results in a tightening of the threshold voltage distribution of the cells.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
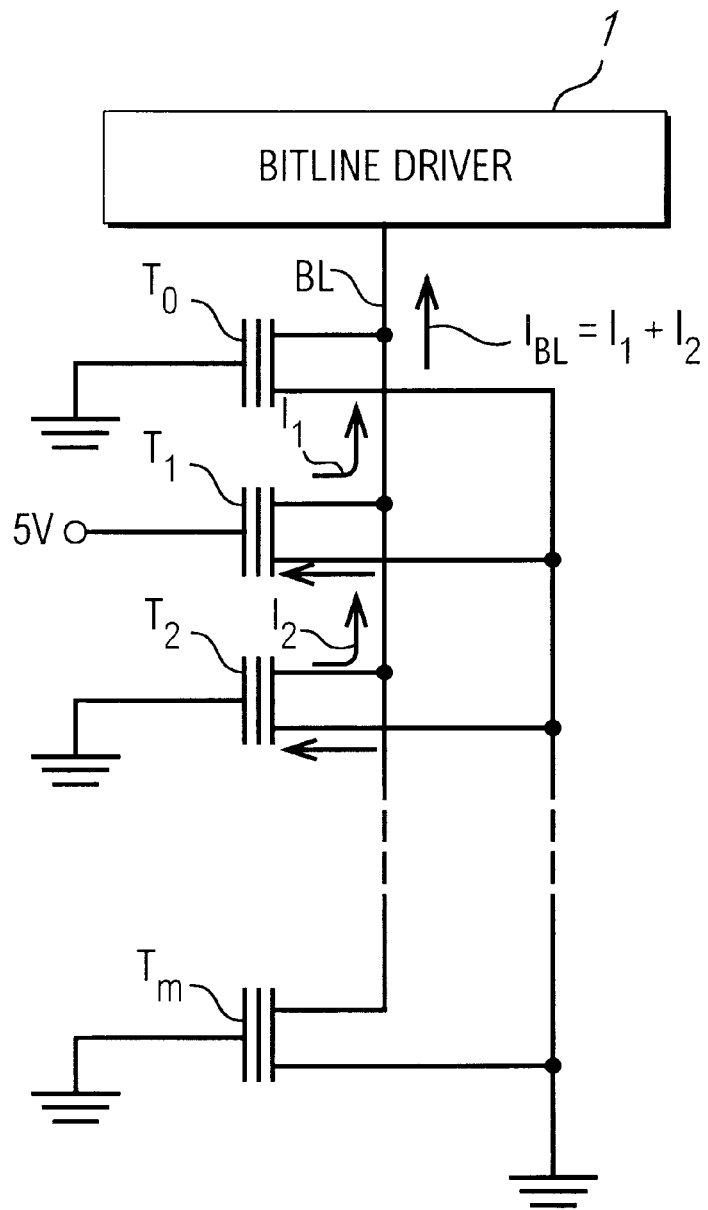
FIG. 1 is a simplified electrical schematic diagram showing how background leakage current is generated in a prior art flash Electrically Erasable Programmable Read-Only Memory (EEPROM)
Figure 2:
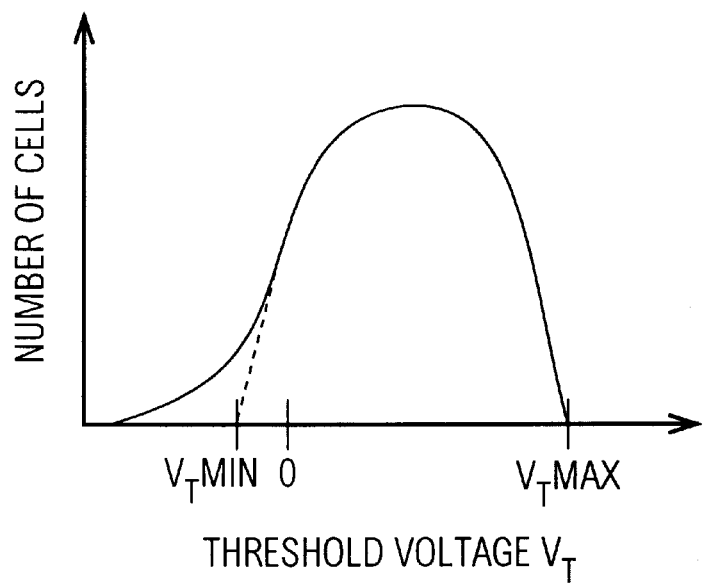
FIG. 2 is a graph illustrating a threshold voltage distribution in a flash EEPROM after an erase operation.
Figure 3:
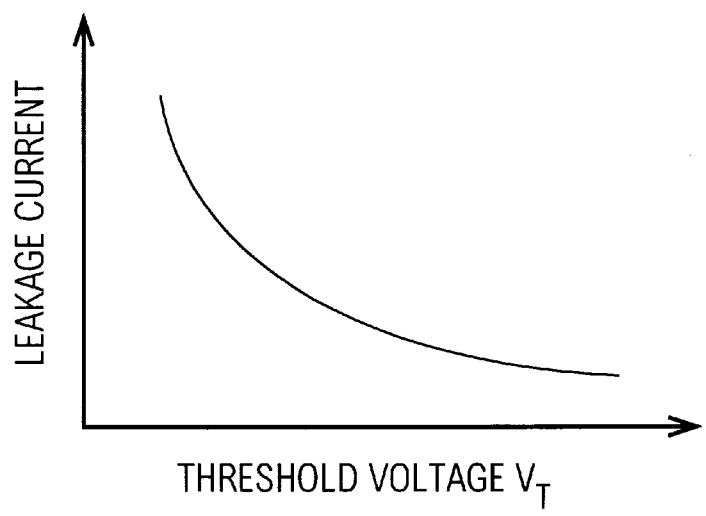
FIG. 3 is a graph illustrating how background leakage current varies as a function of threshold voltage for the least erased cells.
Figure 4:
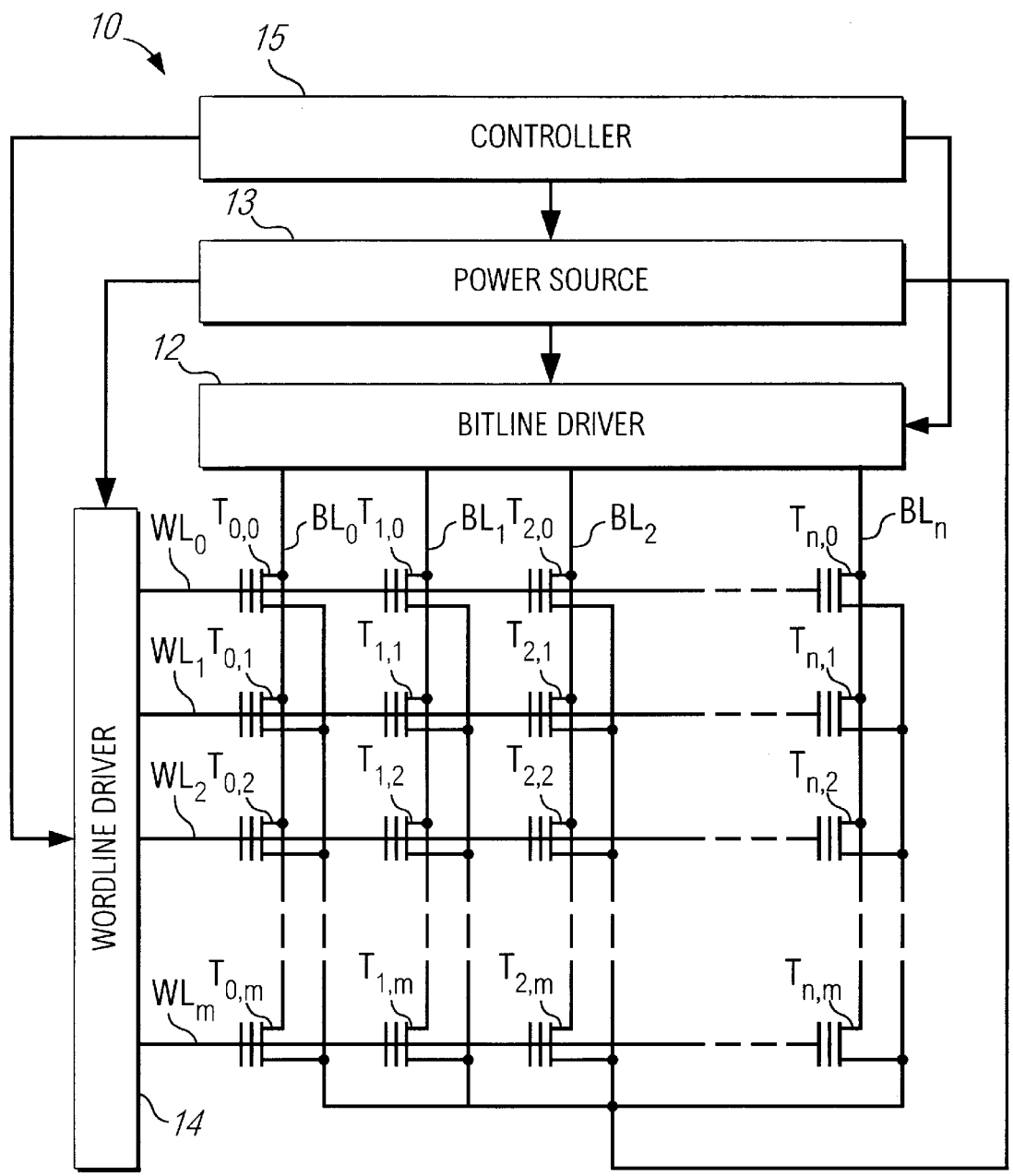
FIG. 4 is a simplified electrical schematic diagram of a flash EEPROM.

FIG. 4 illustrates the basic configuration of a NOR type flash Electrically Erasable Programmable Read-Only Memory (EEPROM) 10 to which the present invention is advantageously applied. The memory 10 comprises a plurality of core or memory cells which are arranged in a rectangular matrix or array of rows and columns. Each row is associated with a wordline, whereas each column is associated with a bitline.

Assuming that there are n columns and m rows, the bitlines are designated as $BL_0$ to $BL_n$ and the wordlines are designated as $WL_0$ to $WL_m$. Appropriate voltages are applied to the bitlines by a bitline driver 12, whereas appropriate voltages are applied to the wordlines by a wordline driver 14. The voltages applied to the drivers 12 and 14 are generated by a power source or supply 13 under the control of a controller 15 which is typically on-chip logic circuitry. The controller 15 also controls the drivers 12 and 14 to address the memory cells individually or collectively as will be described below.

A memory cell is located at each junction of a wordline and a bitline. Each cell includes a Metal-Oxide-Semiconductor (MOS) Field-Effect Transistor (FET) having a source, drain, gate oxide and control gate. The cells of a flash EEPROM differ from conventional FETs in that they additionally include a floating gate and tunnel oxide layer disposed underneath the gate oxide and control gate.

The cells illustrated in FIG. 4 are designated using the notation $T_{n,m}$, where m is the row (wordline) number and n is the column (bitline) number. The control gates of the cells are connected to respective wordlines, and the drains of the cells are connected to respective bitlines as illustrated. The sources of all of the cells are connected to the power supply 13.

A cell is programmed by applying, typically, 9 V to the control gate, 5 V to the drain and grounding the source, which causes hot electrons to be injected from the drain depletion region into the floating gate. Upon removal of the programming voltages, the injected electrons are trapped in the floating gate and create a negative charge therein which increases the threshold voltage of the cell to a value in excess of approximately 4 V.

The cell is read by applying typically 5 V to the control gate and 1 V to the bitline to which the drain is connected, grounding the source, and sensing the bitline current. If the cell is programmed and the threshold voltage is relatively high (4 V), the bitline current will be zero or at least relatively low. If the cell is not programmed or erased, the threshold voltage will be relatively low (2 V), the control gate voltage will enhance the channel, and the bitline current will be relatively high.

Reading, and verifying, as will be described below, are preferably performed using sense amplifiers and a reference current array as disclosed in the above referenced patent to Cleveland. The details of these elements are not the particular subject matter of the present invention.

A cell can be erased in several ways. In one arrangement, a cell is erased by applying typically 12 V to the source, grounding the control gate and allowing the drain to float. This causes the electrons which were injected into the floating gate during programming to be removed by Fowler-Nordheim tunneling from the floating gate through the thin tunnel oxide layer to the source. Alternatively, a cell can be erased by applying a negative voltage on the order of –10 V to the control gate, applying 5 V to the source and allowing the drain to float.

Figure 5:
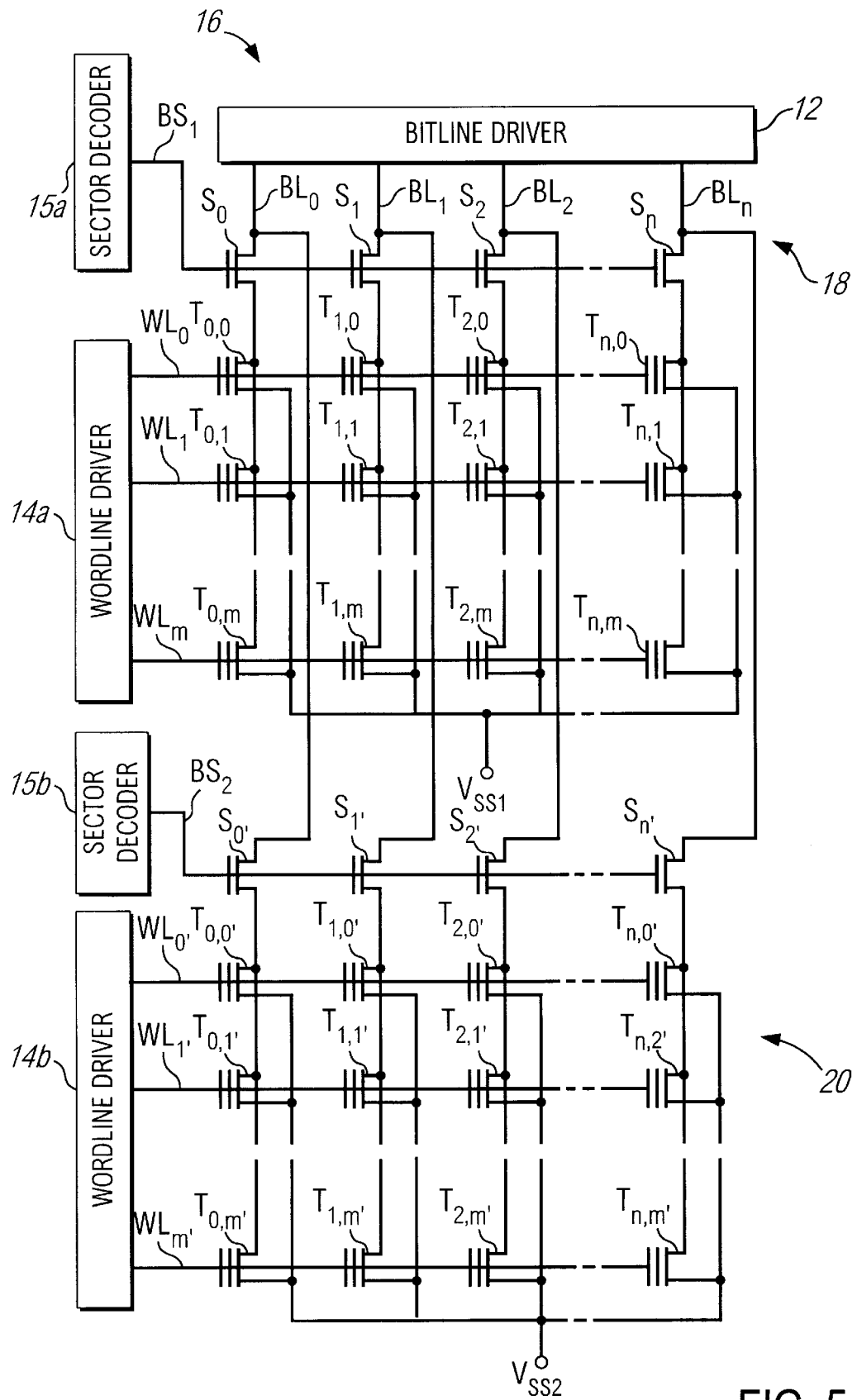
FIG. 5 is similar to FIG. 4 but illustrates a flash EEPROM having cells arranged in pages or banks.

FIG. 5 illustrates another flash EEPROM memory 16 which is similar to the memory 10 except that the cells are divided into a plurality, in the illustrated example two, of banks (also known as pages or sectors), each of which can be programmed, erased and read independently. The memory 16 includes a first cell bank 18 and a second cell bank 20. The memory cells in the first bank 18 are designated in the same manner as in FIG. 4, whereas a prime symbol is added to the designations of the cells in the second bank 20. The wordlines of the banks 18 and 20 are connected to separate wordline drivers 14a and 14b respectively.

In addition to the memory cells, each bank 18 and 20 includes a select transistor for each bitline. The select transistors for the banks 18 and 20 are designated as $S_0$ to $S_n$ and $S_0'$ to $S_n'$ respectively. The drains of the select transistors are connected to the respective bitlines, whereas the sources of the select transistors are connected to the drains of the transistors for the wordlines $WL_0$ to $WL_m$ and $WL_0'$ to $WL_m'$.

The select transistors differ from the memory cell transistors in that they are conventional MOSFETs and lack floating gates. The select transistors are switching elements rather than memory elements. The gates of the select transistors for the bank 18 are connected to a bank select output $BS_1$ of a sector decoder 15a, whereas the gates of the select transistors for the bank 20 are connected to a bank select output $BS_2$ of a sector decoder 15b.

The sources of the cells in bank 18 are connected to a common source supply voltage $V_{ss}1$, whereas the sources of the cells in the bank 20 are connected to a common source supply voltage $V_{ss}2$.

The bank 18 is selected by applying a logically high signal to the bank select line $BS_1$ which turns on the transistors $S_0$ to $S_n$ and connects the bitlines $BL_0$ to $BL_n$ to the underlying memory cells. The bank 18 is deselected by applying a logically low signal to the bank select line $BS_1$ which turns off the transistors $S_0$ to $S_n$ and disconnects the memory cells from the bitlines. The bank 20 is selected and deselected in an essentially similar manner using the bank select signal $BS_2$ and select transistors $S_0'$ to $S_n'$. The operation of the memory 16 is essentially similar to that of the memory 10, except that the program, erase and read operations are performed on the banks 18 and 20 sequentially and independently.

Figure 6:
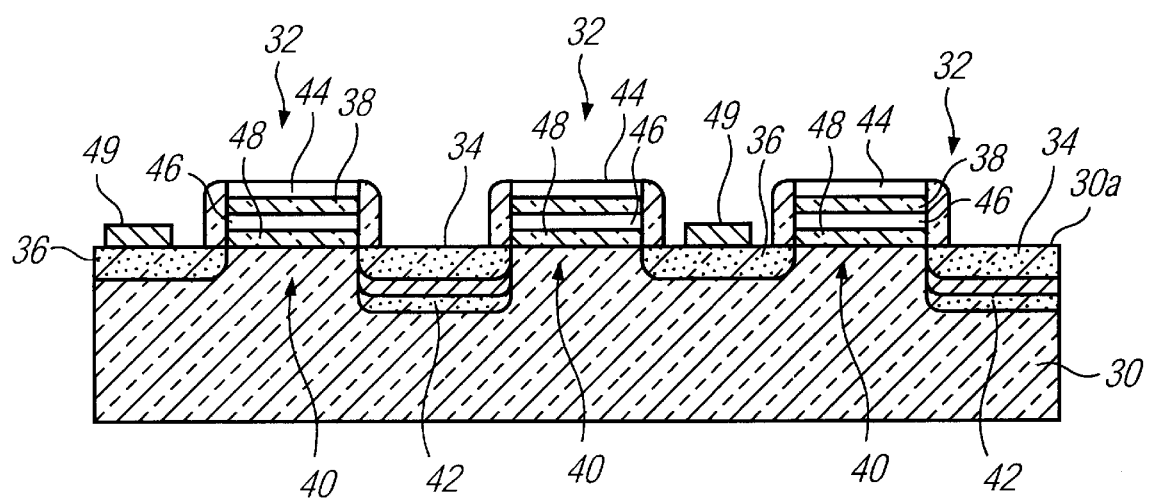
FIG. 6 is a simplified partial sectional view of a flash EEPROM illustrating the elements of the cells thereof.

FIG. 6 is a simplified sectional view illustrating the construction of the individual memory cells of the memory 10 or 16. The memory is formed on a silicon or other semiconductor substrate 30. Three erasable memory cells 32 are illustrated as being formed on a surface 30a of the substrate 30, each including a Metal-Oxide-Semiconductor (MOS) Field-Effect Transistor (FET) structure having a source 34, drain 36, an interdielectric layer 38, and channel 40 underlying a tunnel oxide layer 48. A polysilicon control gate 44 is formed over each gate oxide layer 38, and a polysilicon floating gate 46 and the tunnel oxide layer 48 are formed underneath the control gate 44 over the channel 40.

Each pair of cells 32 is arranged to share a common source 34 and drain 36. The sources 34 are connected to a common source line, whereas a bitline connection 49 is formed on each drain 36.

Figure 7:
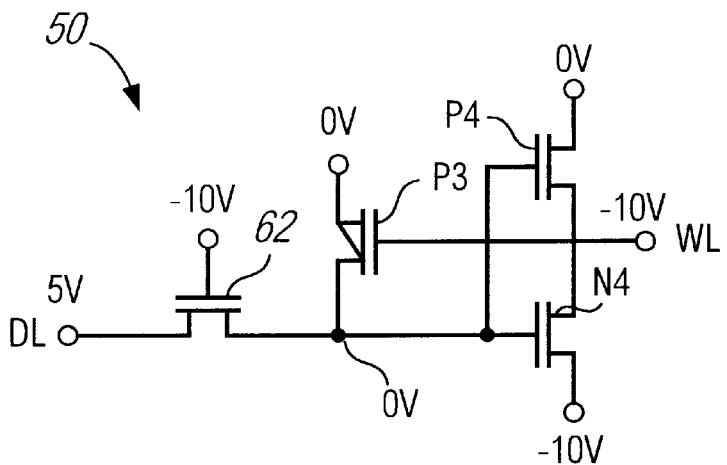
FIG. 7 is an electrical schematic diagram illustrating a conventional half-latch wordline driver circuit.

The wordline drivers 14a and 14b each include a driver circuit for applying the required voltages to the wordlines of the memories 10 and 16. A conventional driver circuit 50 which is known in the art as a half-latch is illustrated in FIG. 7. The circuit 50 includes a pass gate transistor G2 which is connected between a data line DL and the gates of an NMOS transistor N4 and a PMOS transistor P4. The drain of the transistor N4 and the drain of the transistor P4 are connected to a wordline WL, and also to the gate of a PMOS transistor P3. The transistors N4 and P4 constitute a Complementary Metal-Oxide-Semiconductor (CMOS) inverter.

It will be assumed that for an erase operation it is desired to apply −10 V to the wordline WL and thereby to the control gates of the cells connected thereto, apply 5 V to the sources of the cells, and allow the drains to float. The erase operation is performed in two stages. First, 5 V is applied to the data line DL and also to the gate of the pass gate transistor G2. 5 V is also applied to the sources of the transistors P3 and P4, whereas the source of the transistor N4 is grounded (0 V). With these voltages applied, the 5 V on the data line DL is applied to the gates of the transistors N4 and P4, turning on the transistor N4 and turning off the transistor P4.

The wordline WL is pulled down to 0 V by the transistor N4, and 0 V is thereby applied to the transistor P3 which is turned on. The gates of the transistors N4 and P4 are pulled up to 5 V by the transistor P3. Thus, the circuit 50 is latched into a condition in which the transistors N4 and P3 are turned on and the transistor P4 is turned off.

Next, −10 V is applied to the pass gate transistor G2 which is turned off and disconnects the transistors P3, P4 and N4 from the data line DL. The voltages applied to the transistors P3, P4 and P5 are then ramped to the values shown in FIG. 7 by charge pumps and switches (not shown) in the power supply 13. More specifically, the sources of the transistors P3 and P4 are ramped to 0 V and the source of the transistor N4 is ramped to −10 V. These voltages are maintained for the duration of the erase pulse.

Although the voltages applied to the transistors P3, P4 and P5 are changed, the states of these transistors remain latched as described above. The transistor N4 is turned on, thereby pulling the wordline WL to −10 V. The transistor P4 is turned off. The wordline voltage of −10 V is applied to the gate of the transistor P3 which is turned on and pulls the gates of the transistors N4 and P4 to 0 V. In this manner, the circuit 50 is latched to a state which results in an erase pulse of −10 V being applied to the wordline WL even though the data line DL has been disconnected from the transistors P3, P4 and N4.

Figure 8:
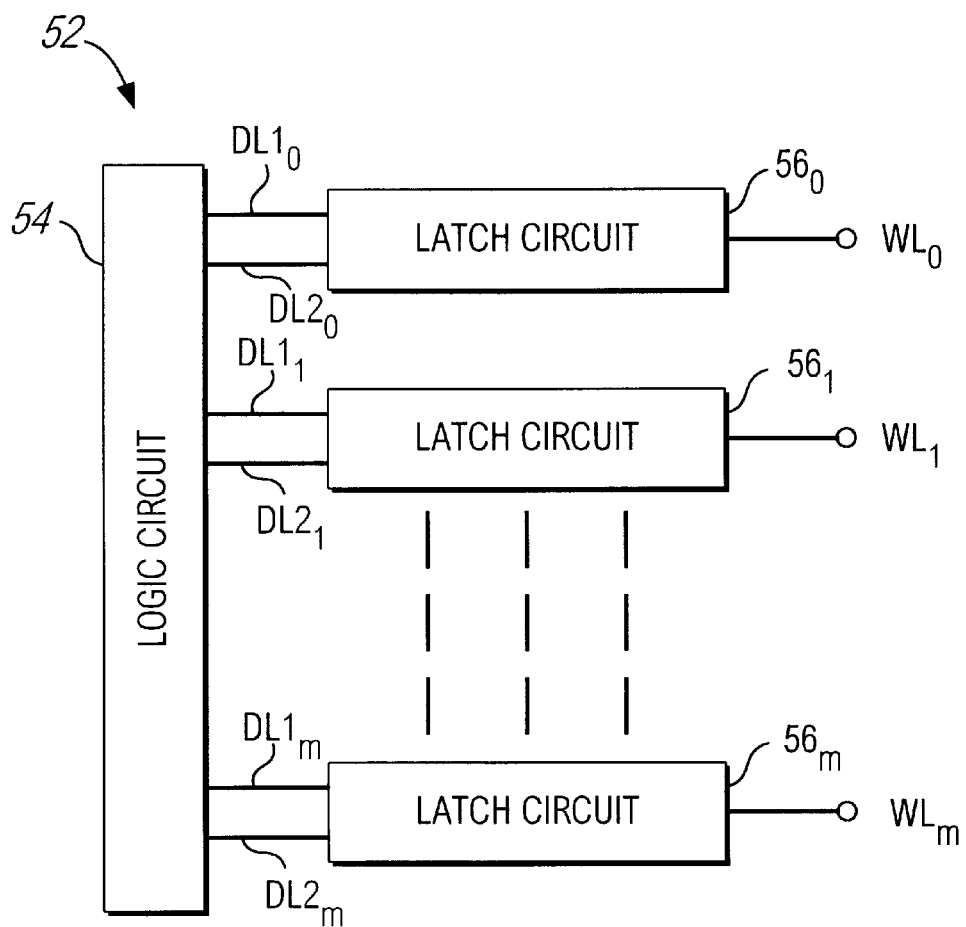
FIG. 8 is a diagram illustrating a wordline driver embodying the present invention.

FIG. 8 illustrates a wordline driver 52 embodying the present invention. The driver 52 includes a logic circuit 54 which has outputs connected to memory latch circuits $56_0$ to $56_m$ which in turn have outputs connected to the wordlines $WL_0$ to $WL_m$ respectively. The logic circuit 54 applies two data outputs to each latch circuit $56_0$ to $56_m$, designated as $DL1_0$, $DL2_0$ to $DL1_m$, $Dl2_m$ respectively.

The latch circuits enable respective wordlines to be selected or deselected for receiving erase pulses. This reduces the number of erase pulses that are applied to cells which are already erased, thereby increasing their endurance.

The present invention can be practiced in several ways. However, in all embodiments of the invention an erase verify test or procedure is performed on the cells after application of an erase pulse, and wordlines in which all of the cells have passed the erase verify test (all of the cells have been verified to have been erased) are deselected.

Figure 9:
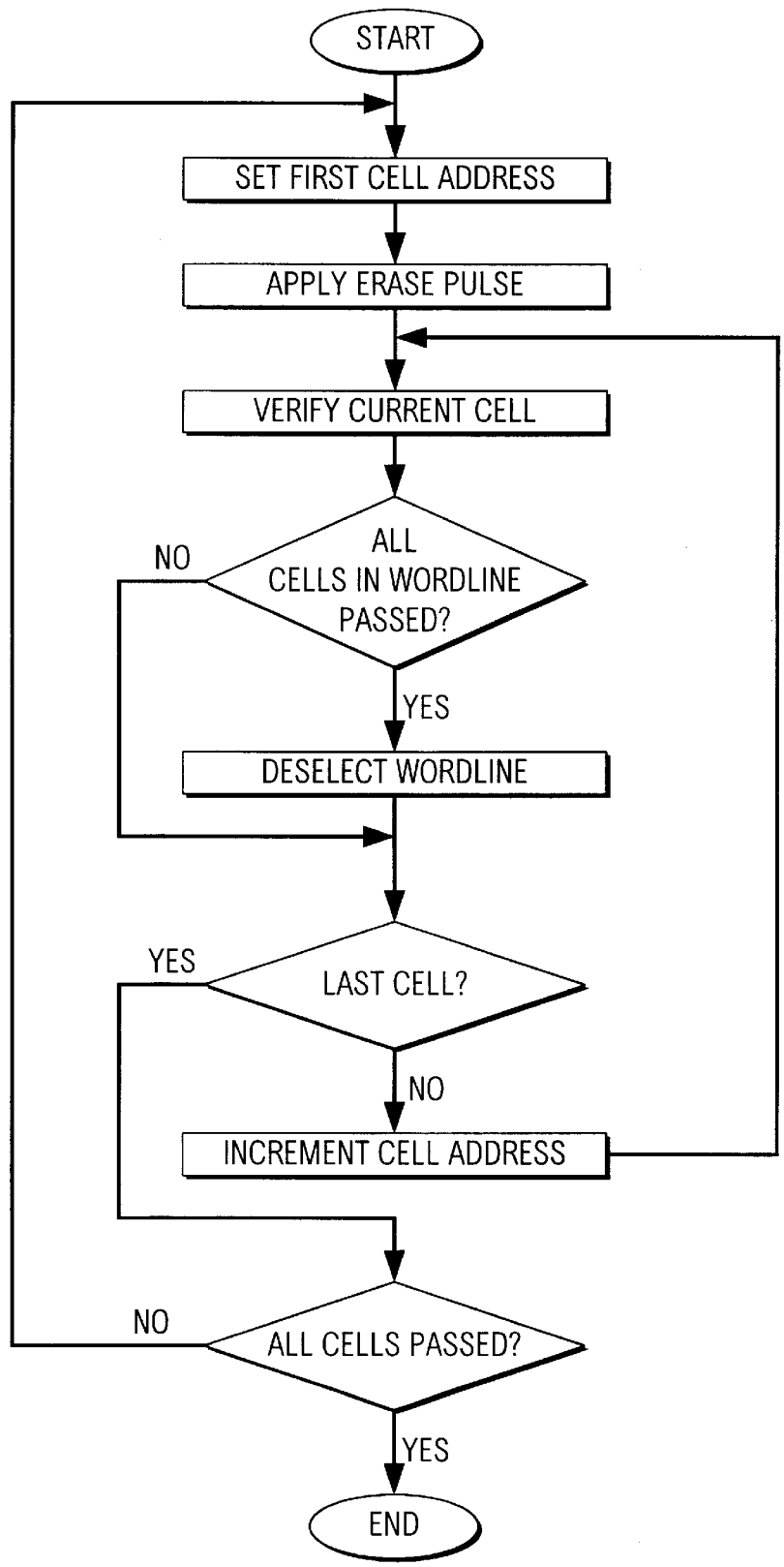
FIG. 9 is a flowchart illustrating a method of erasing a flash EEPROM in accordance with the invention.

A first method embodying the present is illustrated in the form of a flowchart in FIG. 9. In this method, an erase pulse is applied to all of the wordlines. Then, all of the cells are erase verified in sequence. If all of the cells in a particular wordline pass erase verify, the wordline is deselected by setting the respective memory latch circuit shown in FIG. 8 so that no further erase pulses can be applied to the deselected wordline.

Following the erase verify procedure, if any cells remain unverified (failed to pass the erase verify test), another erase pulse is applied to all of the wordlines which have not been deselected and all of the cells are again verified. This procedure is repeated until all of the cells pass erase verify.

More specifically, the controller 15 sets the address of the first cell in the memory and applies an erase pulse to all of the wordlines that are not deselected (at this point there are no deselected wordlines). Then, the controller 15 causes the first cell to be verified. If all of the cells in the same wordline as the cell which is being verified have passed erase verify (this will not be the case for the first cell after the first erase pulse has been applied), the wordline is deselected.

Then, a test is made to see if the cell being verified is the last cell in the memory. If not, the controller increments the cell address and loops back to erase verify the next cell. If the cell passes erase verify, a test is made to see if all of the cells have passed. If the result of this test is true, the process is completed. If not, the method loops back to set the first cell address, apply another erase pulse to the wordlines that are not deselected, and verify all of the cells.

The method described with reference to FIG. 9 substantially increases the endurance of the cells be preventing cells that have already been erased from receiving additional erase pulses. This procedure also tightens the threshold voltage distribution by reducing the possibility of cells becoming overerased.

Although the method of FIG. 9 erase verifies all of the cells regardless of whether they are in wordlines that have been deselected for erase verify, the invention is not so limited, and it is within the scope of the invention to erase verify only the cells in wordlines that have not been deselected. This modification speeds up the erase verify operation but requires additional control circuitry.

Figure 10:
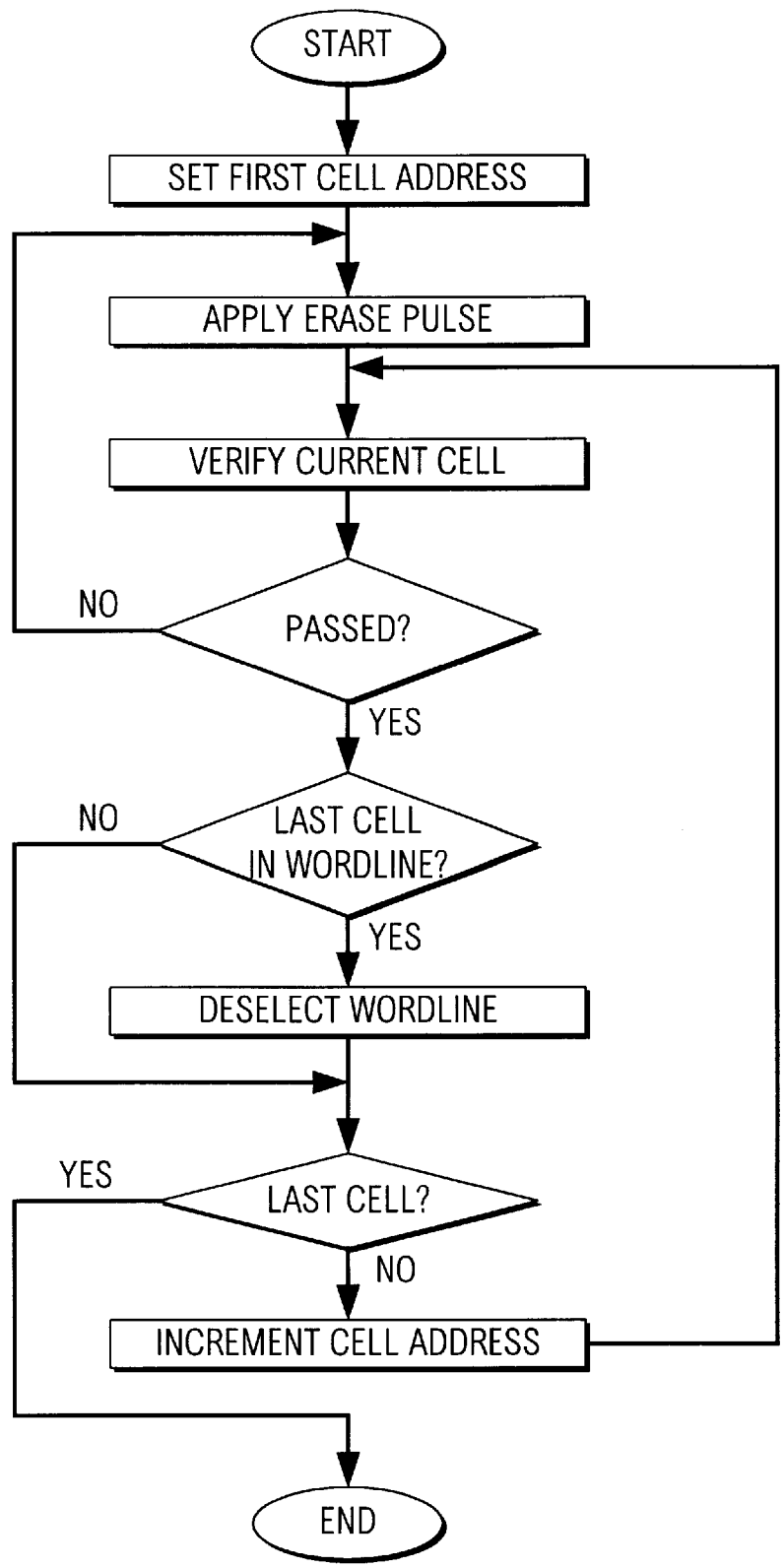
FIG. 10 is similar to FIG. 9 but illustrates an alternative method.

FIG. 10 illustrates another method embodying the present invention. This method is similar to that of FIG. 9, but differs in that each cell is processed in sequence.

More specifically, the first cell address is set and an erase pulse is applied to the wordlines that have not been deselected as in the previous method. Then, the current cell (in this case the first cell) is erase verified. If the cell does not pass erase verify, another erase pulse is applied to all wordlines that have not been deselected. This process is repeated until the current cell passes erase verify.

After the current cell passes erase verify, a test is made to see if the cell is the last cell in the wordline. If so, the wordline is deselected and a test is made to see if the cell is the last in the memory. If so, the erase process is completed. If not, the cell address is incremented and the method loops back to verify the next cell. If the current cell is not the last cell in the wordline, the method bypasses the step of deselecting the wordline.

The method of FIG. 9 requires a longer time to perform the verify operations than the method of FIG. 10 because every wordline has to be erase verified after every erase pulse. The method of FIG. 10 only has to verify a wordline once during the entire process. However, the method of FIG. 9 provides a tighter threshold voltage distribution because fewer erase pulses are applied to the cells than in the method of FIG. 10.

A preferred embodiment of one of the latch circuits 56 of FIG. 8 is illustrated in FIGS. 11 to 20. In addition to the elements of the conventional half-latch circuit 50 of FIG. 7, the circuit 56 includes an NMOS transistor N3 having a source connected to the source of the transistor N4, a drain connected to the drain of the transistor P3 and a gate connected to the gate of the transistor P3.

The transistors P3, P4, N3 and N4 in combination constitute a driver latch 58 in the form of a set-reset flip-flop. In contrast to the half-latch 50 of FIG. 7, the driver latch 58 is a full latch.

The latch circuit 56 further includes a memory latch 60 which is another full latch constituted by a set-reset flip-flop. The memory latch 60 includes transistors P1, P2, N1 and N2 which are interconnected in the same manner as in the driver latch 58. The data line DL1 is connected to the gates of the transistors P2 and N2. A pass gate transistor G1 is connected between the junction of the transistors and N2 and P2 and the pass gate G2. Another pass gate transistor G3 is connected between the data line DL2 and the junction of the transistors G1 and G2.

The data line DL1 and transistor G1 are used to set the driver latch 58 for an erase or program operation, whereas the data line DL2 and transistor G3 are used to set the driver latch 58 for an erase verify operation. The transistor G2 can be turned off to disconnect the driver latch 58 from the transistors G1 and G3 and thereby from the memory latch 60 as will be described below.

Figure 11:
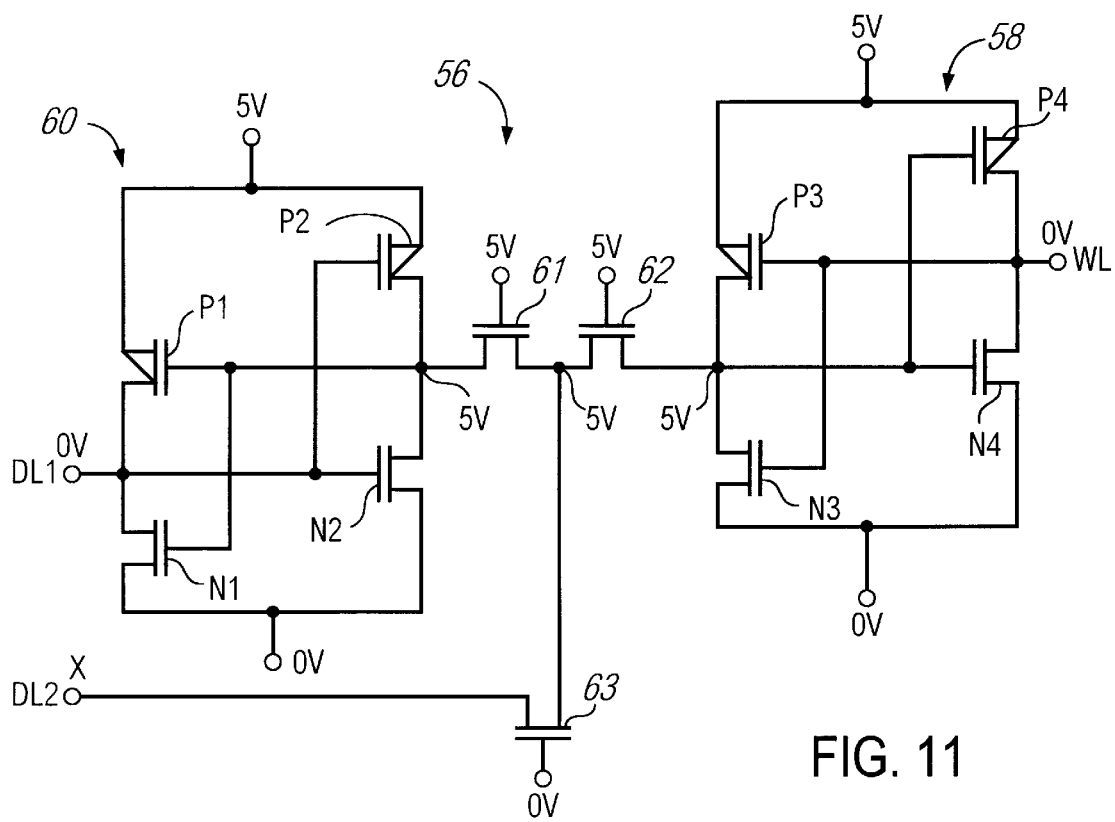
FIGS. 11 to 14 are electrical schematic diagrams illustrating a wordline driver according to the invention with voltages applied thereto for performing an erase operation.
Figure 12:
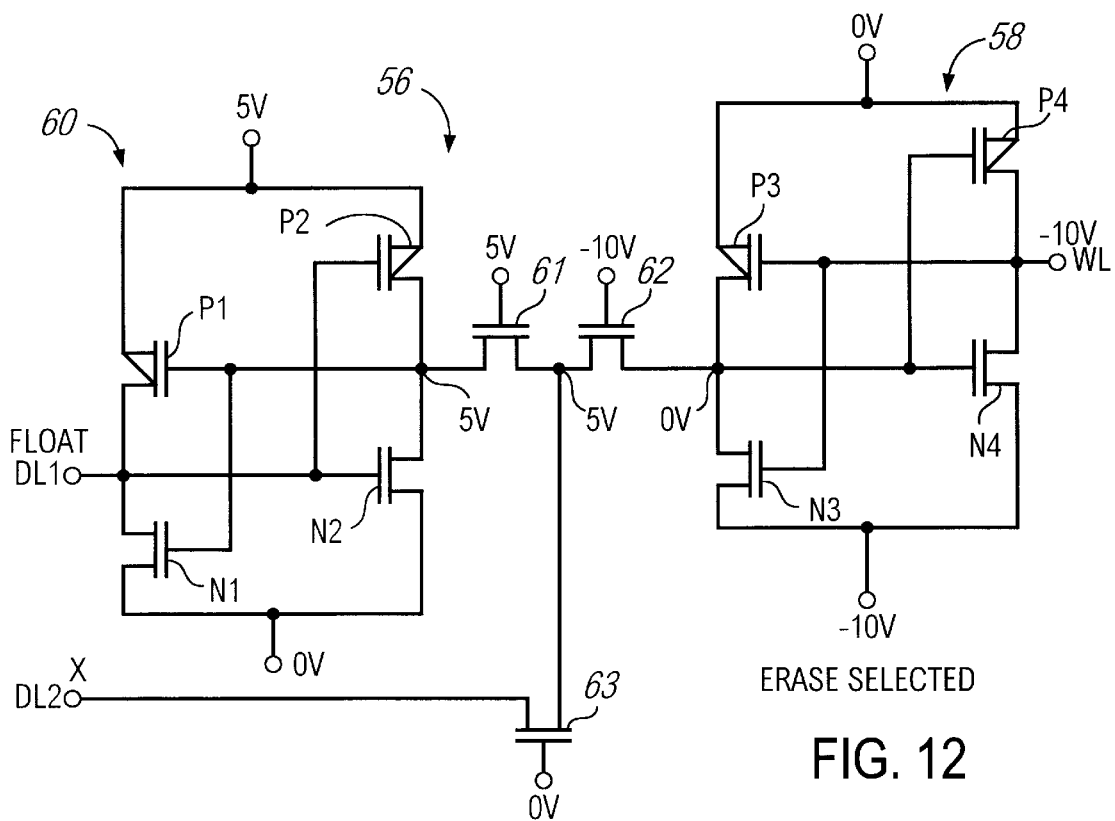

FIGS. 11 and 12 illustrate the operation of applying a −10 V erase pulse to a selected wordline WL (a wordline that has not been deselected as described above). At the beginning of the erase operation prior to verifying the first cell, the memory latches 60 for all of the wordlines are set so that erase pulses will be applied. This is done by applying a power supply voltage of $V_{cc}=5$ V to the sources of the transistors P1 to P4 and applying a power supply voltage of $V_{ss}=0$ V to the sources of the transistors N1 to N4.

5 V is applied to the gates of the transistors G1 and G2 to turn them on, whereas 0 V is applied to the gate of the transistor G3 to turn it off and disconnect the data line DL2 from the driver latch 58. In this condition, the voltage on the data line DL2 is irrelevant as indicated by "X".

With the applied voltages applied as described above and illustrated in FIG. 11, the latches 58 and 60 function as conventional logic elements, more specifically set-reset flip-flops. A data level of 0 V is applied to the data line DL1 which turns on the transistors P2 and N1 and turns off the transistors P1 and N2. The transistor P2 pulls the input to the transistor G1 up to 5 V, and this voltage is applied through the transistors G1 and G2 to the gates of the transistors P4 and N4.

This 5 V level turns on the transistors N4 and P3 and turns off the transistors P4 and N3. Due to the configuration of the latches 58 and 60, this state is set into the latches 58 and 60 and maintained in a stable manner. After the latches 58 and 60 have been set, the memory latch 60 is disconnected from the data line DL1 so that the gates of the transistors P2 and N2 are not driven from the DL1 input.

The memory latch 60 is an element which causes the wordline WL to be selected or deselected to receive an erase pulse. The operation described above sets the latch 60 to apply an erase pulse to the wordline WL. To actually apply the pulse, −10 volts is applied to the transistor 62 to turn it off and disconnect the driver latch 58 from the memory latch 60. Then, the controller 15 controls the charge pumps (not shown) in the power supply 13 to ramp the voltage applied to the drains of the transistors P3 and P4 from 5 V down to 0 V. The power supply 13 is also controlled to ramp the voltage applied to the sources of the transistors N3 and N4 from 0 V down to −10 V.

Although the voltages applied to the driver latch 58 are changed, the state of the latch 58 remains unchanged. More specifically, the transistors N4 and P3 remain turned on and the transistors P4 and N3 remain turned off. This results in the wordline WL being pulled to −10 V by the transistor N4. This condition is maintained for the duration of the erase pulse with −10 V being applied to the wordline WL.

Figure 13:
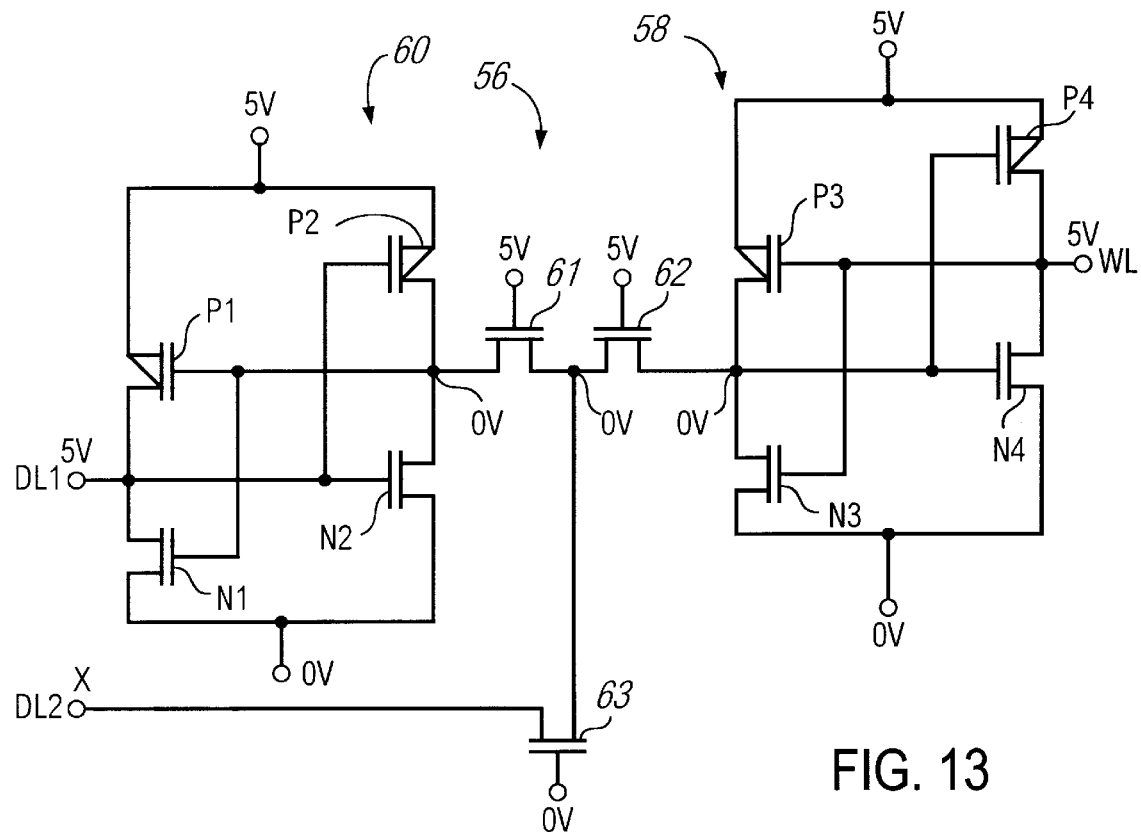
Figure 14:
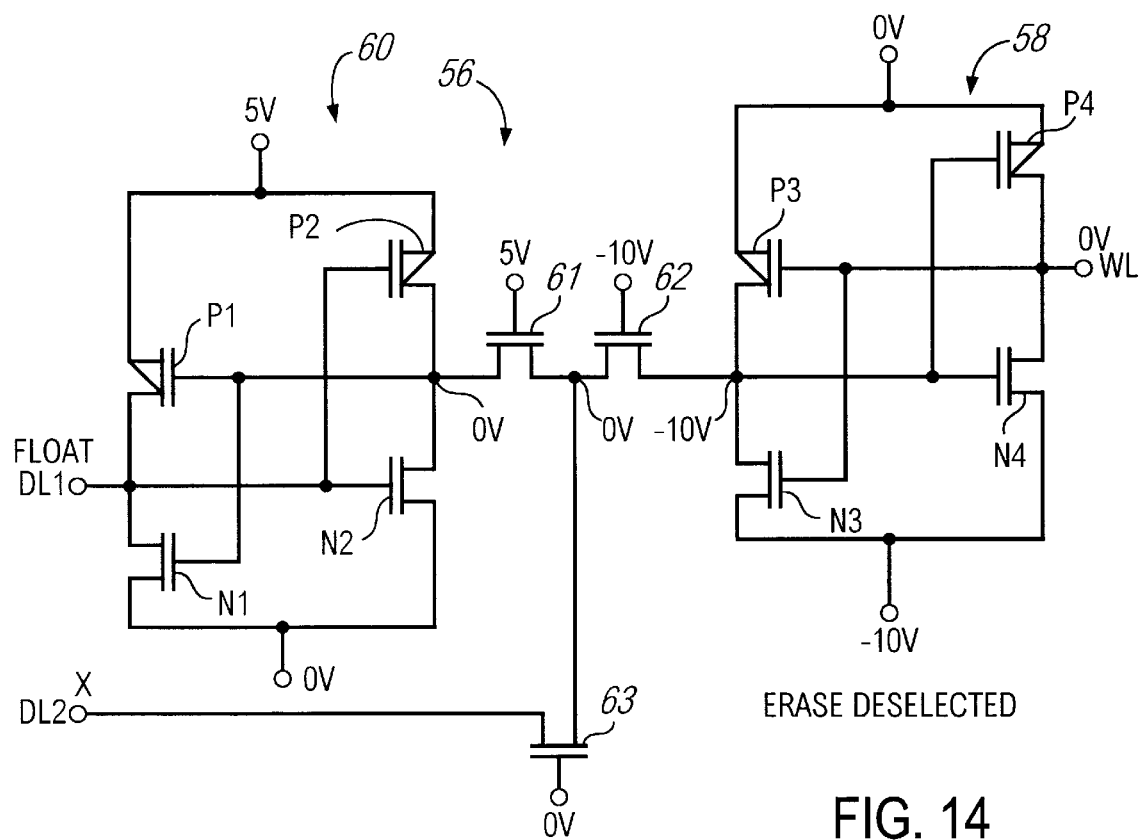

FIGS. 13 and 14 illustrate how the wordline WL is deselected or set so that −10 V will not be applied thereto while erase pulses are being applied to other (not deselected) wordlines. In FIG. 13, the 5 V and 0 V power supply voltages are applied to the latches 58 and 60 in the manner described with reference to FIG. 11. However, after all of the cells connected to the wordline WL have passed erase verify, the controller 15 connects the data line DL1 to the gates of the transistors P2 and N2 and applies a logic level signal of 5 V to the data line DL1.

This causes the transistors N2 and P1 to be turned on and the transistors P2 and N1 to be turned off. The voltage at the junction of the transistors P2 and N2 is pulled down to 0 V by the transistor N2, and this voltage is applied through the transistors G1 and G2 to the gates of the transistors P4 and N4. This causes the transistors P4 and N3 to be turned on and the transistors N4 and P3 to be turned off. The wordline WL is pulled up to 5 V by the transistor P4.

The erase pulse operation for a deselected wordline is illustrated in FIG. 14. The memory latch 60 is disconnected from the data line DL1 and the voltages applied to the driver latch 58 are ramped to 0 V and −10 V as described with reference to FIG. 12. However, since the transistor P4 is turned on and the transistor N4 is turned off, the wordline is pulled to 0 V by the transistor N4. In this manner, the deselected wordline WL does not receive an erase pulse voltage of −10 V, but instead is held at 0 V. Thus, the cells connected to the wordline WL do not receive the erase pulse stress and are prevented from becoming overerased.

FIGS. 11 to 14 illustrate the operation of the latch circuit 56 in an application in which a negative erase pulse is applied to a wordline. However, the invention is not so limited, and will function in an essentially comparable manner in a case in which a positive or 0 V erase pulse is to be applied to a wordline. This is because the present inventive concept of using memory elements or latches to deselect wordlines which have passed erase verify is applicable to any suitable combination of voltages.

Figure 15:
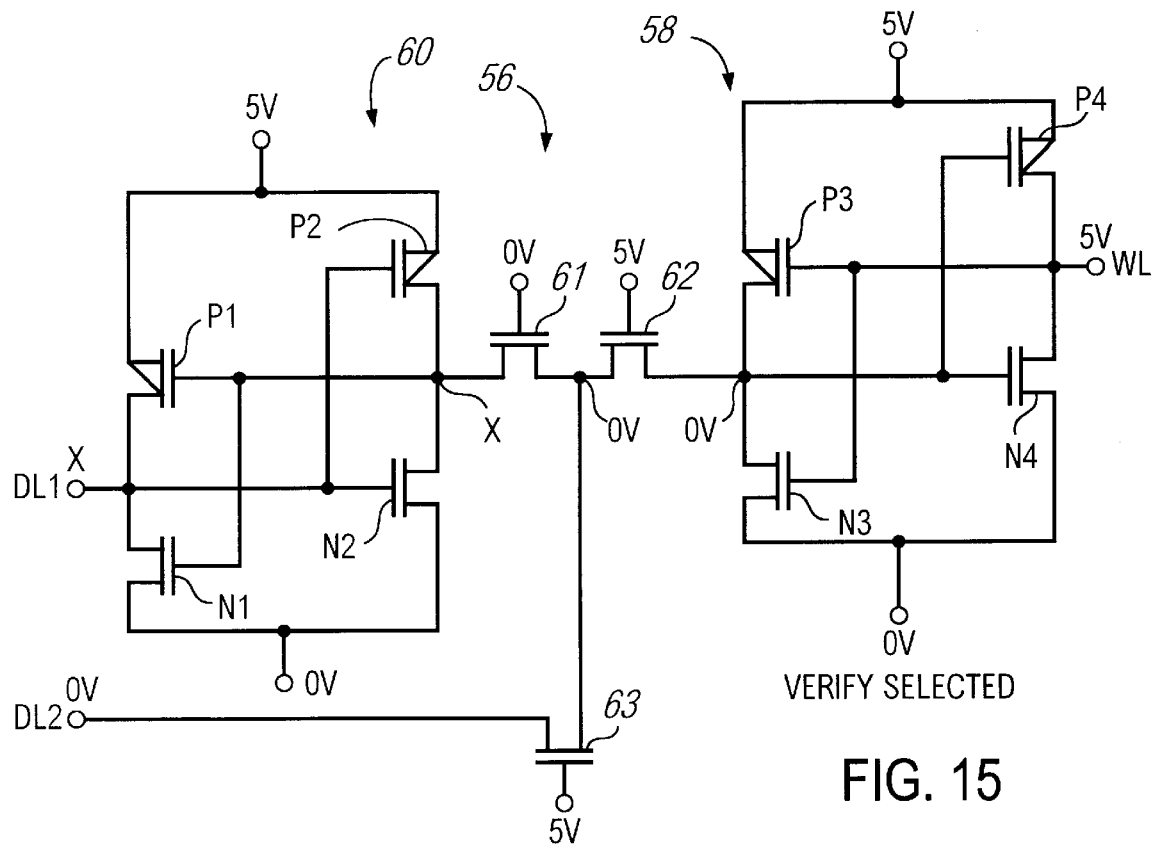
FIGS. 15 and 16 are electrical schematic diagrams illustrating a wordline driver according to the invention with voltages applied thereto for performing an erase verify operation.
Figure 16:
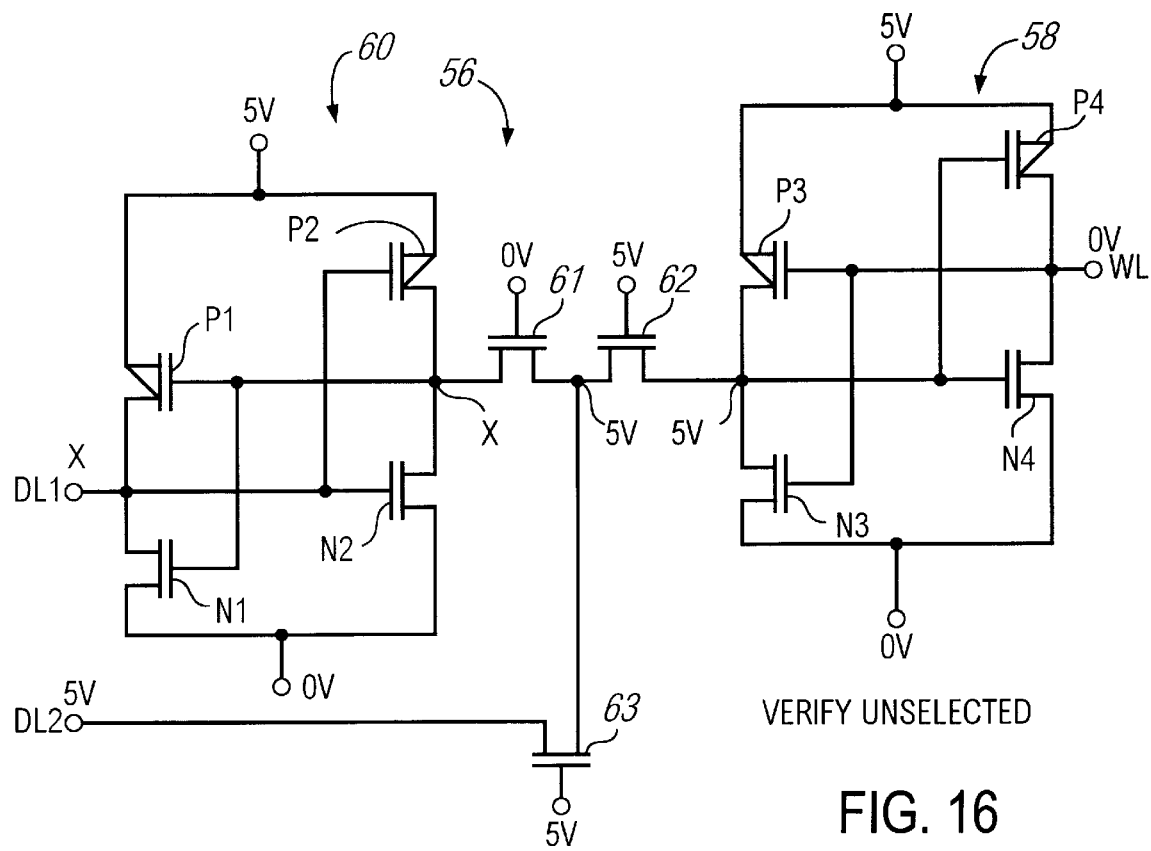

FIGS. 15 and 16 illustrate how the latch circuit 56 is operated during an erase verify mode of operation. In this case, 5 V is to be applied to a selected wordline and 0 V is to be applied to unselected wordlines.

FIG. 15 illustrates the erase verify operation for a selected wordline. 0 V is applied to the transistor G1 to disconnect the memory latch 60 from the driver latch 58, and 5 V is applied to the transistors G2 and G3 to turn them on. 0 V is applied to the data line DL2, and this voltage is applied through the transistors G3 and G2 to the gates of the transistors N4 and P4. This results in the transistors P4 and N3 being turned on and the transistors N4 and P3 being turned off. The wordline WL is pulled to 5 V as desired by the transistor P4.

FIG. 16 illustrates the erase verify operation for an unselected wordline. The applied voltages are the same as in FIG. 15 except that 5 V is applied to the data line DL2. This causes the transistors N4 and P3 to be turned on and the transistors P4 and N3 to be turned off. The wordline WL is pulled down to 0 V by the transistor N4.

Figure 17:
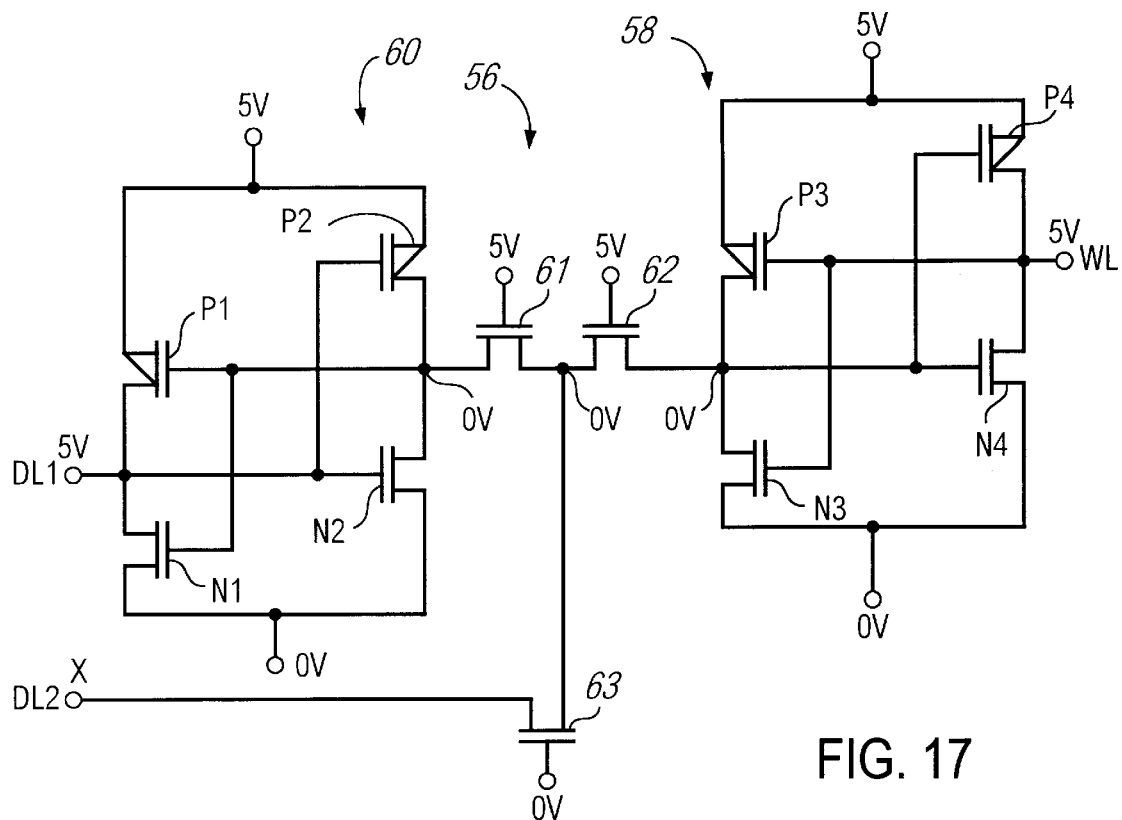
FIGS. 17 to 20 are electrical schematic diagrams illustrating a wordline driver according to the invention with voltages applied thereto for performing a programming operation.
Figure 18:
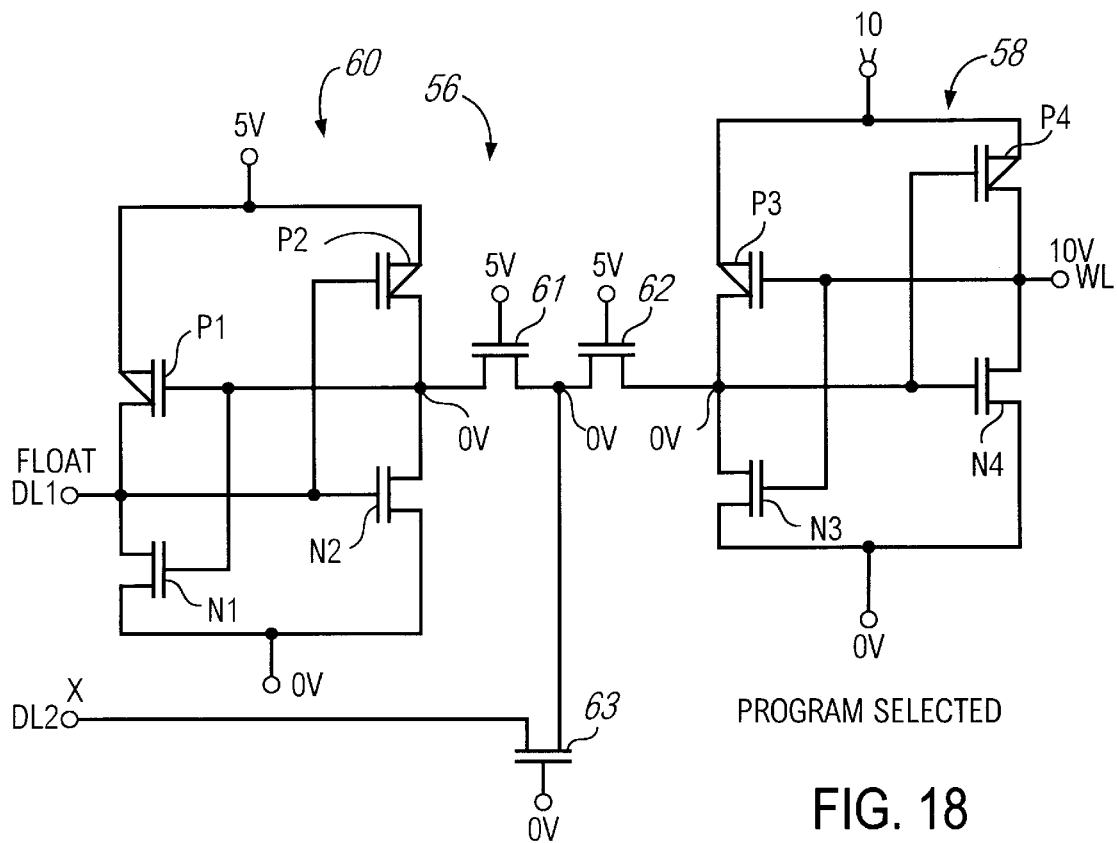

FIGS. 17 and 18 illustrate how the latch circuit 56 is operated for programming a selected wordline. In this case, it is desired to apply 10 V to the selected wordline.

In FIG. 17 the power supply voltages 5 V and 0 V are applied to the latches 58 and 60 as described above. The transistor G3 is turned off by applying 0 V to its gate, whereas the transistors G1 and G2 are turned on by a 5 V applied gate voltage. 5 V is applied to the data line DL1 which causes the transistors N2 and P1 to be turned on and the transistors P2 and N1 to be turned off.

The input to the transistor G1 is pulled down to 0 V by the transistor N2. This voltage turns on the transistors P4 and N3 and turns off the transistors N4 and P3. The wordline WL is pulled up to 5 V by the transistor P4.

In FIG. 18, the memory latch 60 is disconnected from the data line DL1, the voltage applied to the sources of the transistors P3 and P4 is ramped up to 10 V and the voltage applied to the sources of the transistors N3 and N4 is maintained at 0 V. Since the transistor P4 is turned on, it pulls the wordline WL up to 10 V as desired.

Figure 19:
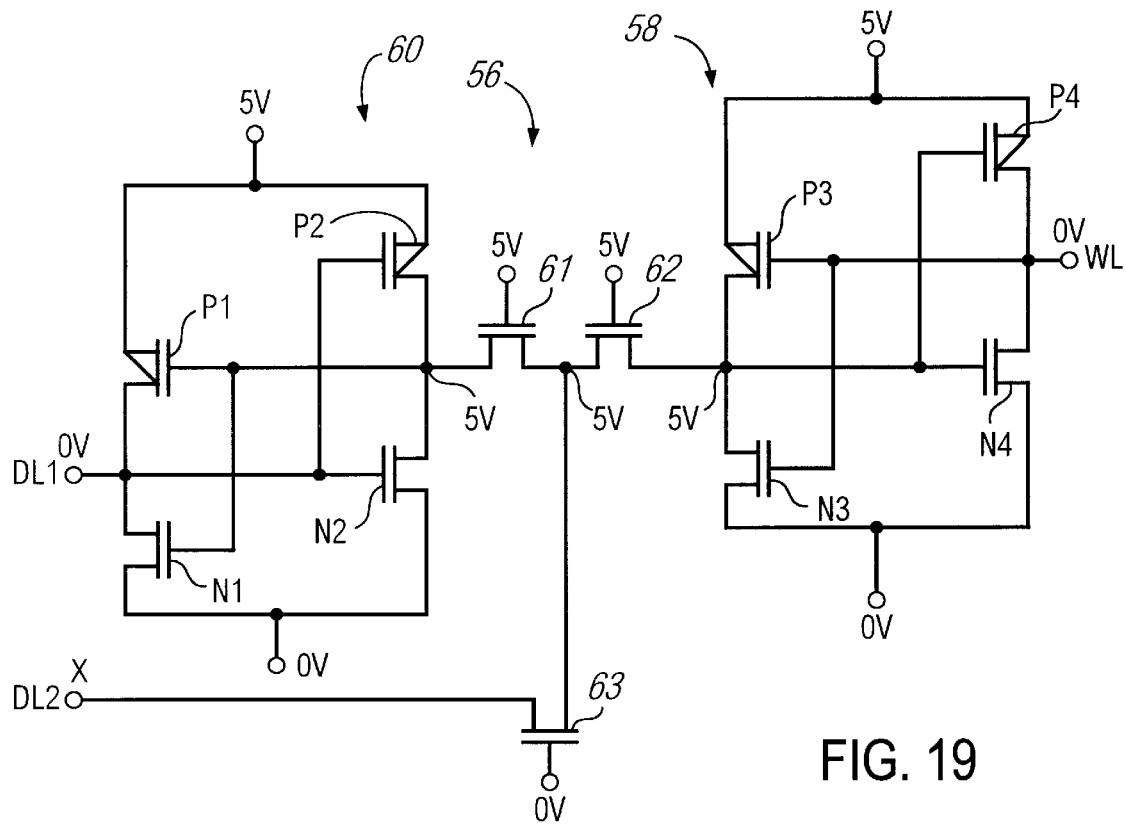
Figure 20:
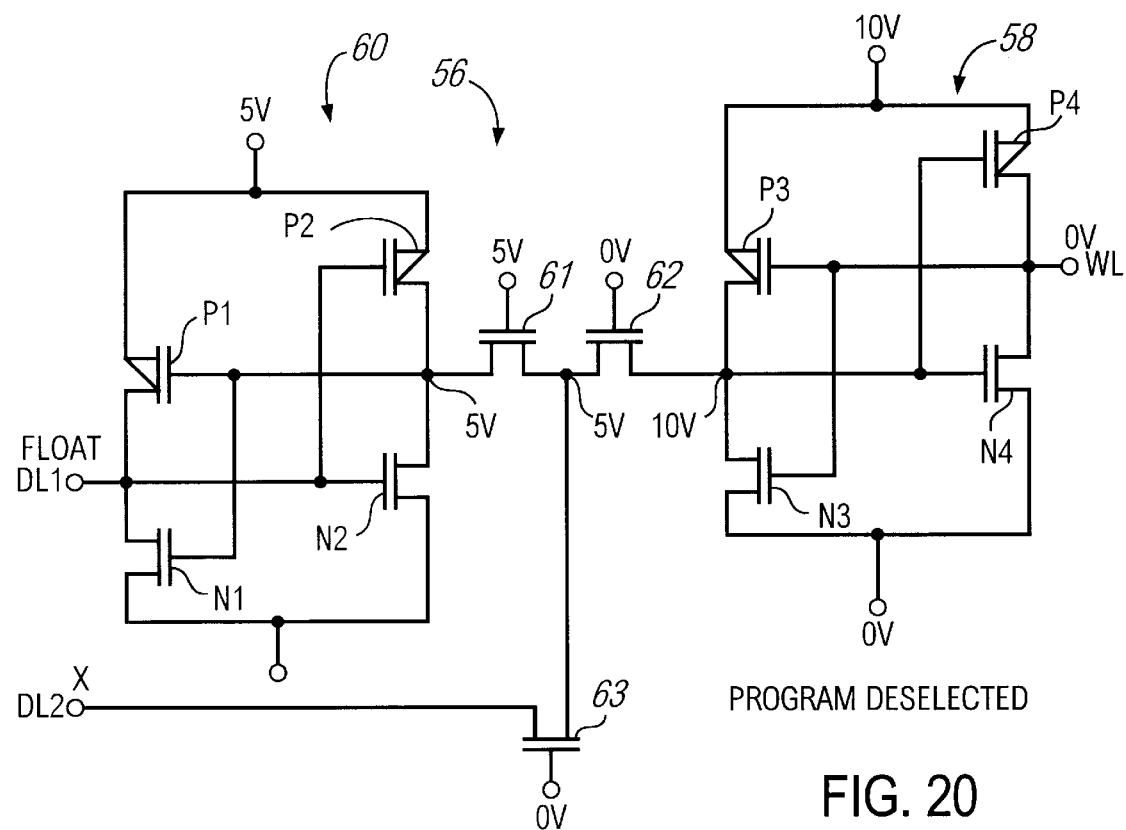

FIGS. 19 and 20 illustrate the program operation for a deselected wordline. The applied voltages in FIG. 19 are the same as in FIG. 17 except that 0 V is applied to the data line DL1. This causes the transistors N4 and P3 to be turned on and the transistors N3 and P4 to be turned off. This causes the transistor N4 to pull the wordline WL down to 0 V.

In FIG. 20 the power supply voltages are ramped to 10 V and 0 V as in FIG. 18. However, the unselected wordline WL remains at 0 V because it is pulled to this voltage by the transistor N4.

In the embodiments of the invention described above, a memory latch as well as a driver latch are provided for each wordline. However, the invention is not so limited, and it is within the scope thereof to provide a single memory latch for a group of wordlines. This enables a single memory latch to deselect any desired number of wordlines. A group of wordlines is deselected by setting a single memory latch when all of the cells connected to the wordlines have passed erase verify.

Figure 21:
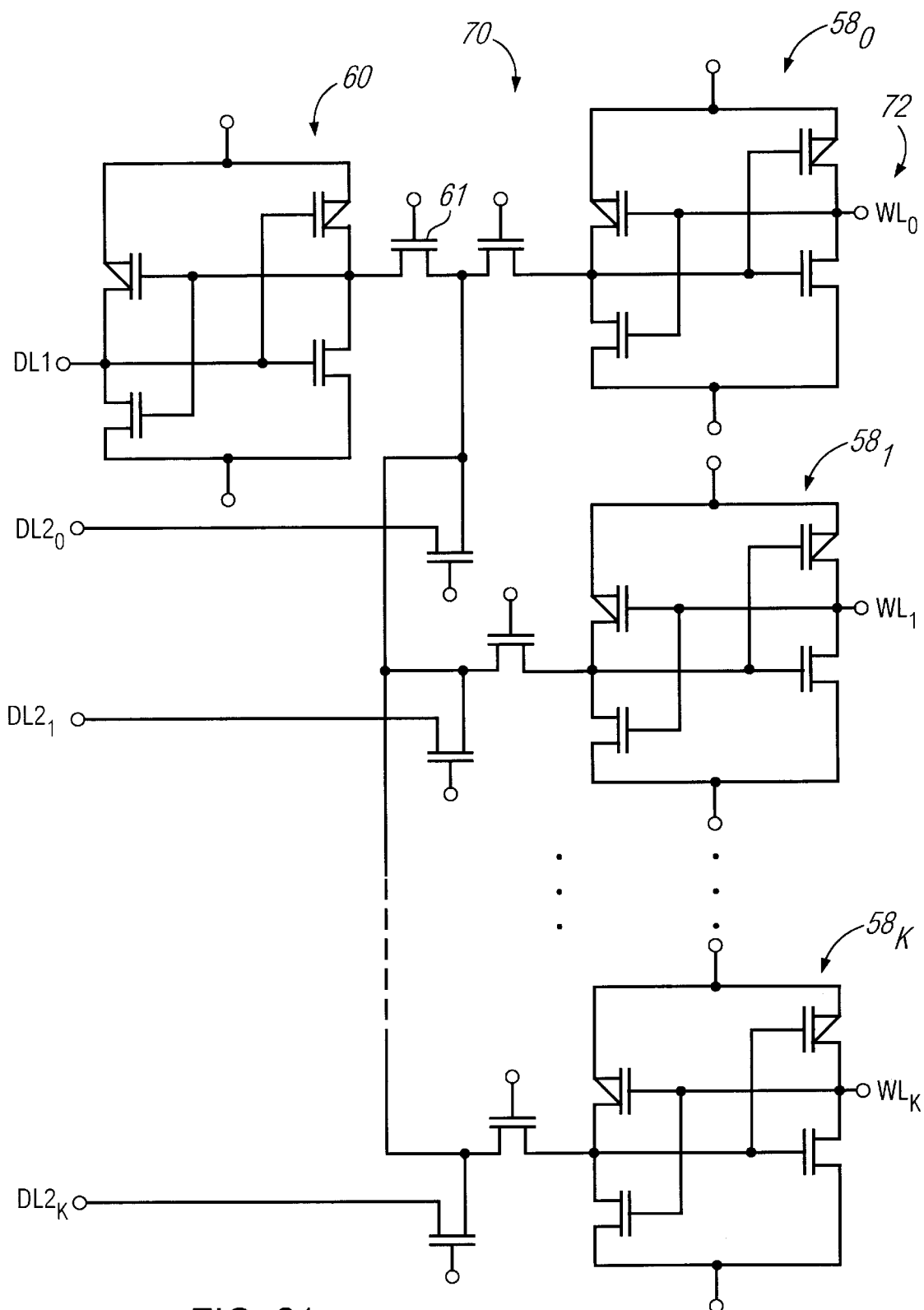
FIG. 21 is an electrical schematic diagram illustrating an alternative embodiment of the invention.

As illustrated in FIG. 21, a latch circuit 70 includes a single memory latch 60 and a group of k driver latches $58_0$ to $58_k$ for a group 72 of k wordlines $WL_0$ to $WL_k$ respectively. The output of the memory latch 60 is connected to the inputs of all of the driver latches through a single pass gate transistor G1. The remaining elements of the latch circuit 70 are essentially similar to those described above and are not individually designated by reference numerals to avoid unnecessary cluttering of the drawing.

The memory latch 60 is used to select or deselect all of the wordlines of the group 72. The memory can be divided into any desired number of groups, each consisting of any desired number of wordlines. The embodiment of FIG. 21 is advantageous in that it requires fewer memory latches than the embodiments in which a memory latch is provided for each wordline. However, the reduction of the number of erase pulses applied to already erased cells is less than in the other embodiments.

In summary, the present invention overcomes the limitations of the prior art and tightens the threshold voltage distribution in a flash EEPROM after erase. This is accomplished by deselecting wordlines for which all of the cells connected thereto have passed erase verify.

Various modifications will become possible for those skilled in the art after receiving the teachings of the present disclosure without departing from the scope thereof. For example, although the embodiments of the invention described and illustrated perform deselection of wordlines using memory elements in the form of latches, the invention is not so limited. For example, the memory elements can be provided as data bits in a read-write memory or register.

A bit representing a wordline that has been erase verified and is to be deselected can be represented by a logical "0" bit, whereas a bit representing a wordline that has not been erase verified and is not to be deselected can be represented by a logical "1" bit (or vice-versa). Prior to ramping the voltages for application of an erase pulse, the controller 15 tests each bit in the wordline memory.

If the bit representing a particular wordline is "1", the controller 15 will set the driver latch 58 for this wordline so that the transistor N4 will be turned on as described above with reference to FIGS. 11 and 12 and the wordline will be pulled to −10 V. Conversely, if the If the bit representing a particular wordline is "0", the controller 15 will set the driver latch 58 for this wordline so that the transistor P4 will be turned on as described above with reference to FIGS. 13 and 14 and the wordline will be pulled to 0 V.

We claim:

1. A method for erasing a flash Electrically-Erasable Programmable Read-Only Memory (EEPROM) which includes a plurality of floating gate transistor memory cells connected to wordlines, comprising the steps of:

(a) applying an erase pulse to all wordlines that are not deselected;

(b) erase verifying a next cell;

(c) if said next cell and all other cells connected to a same wordline as said next cell have passed erase verify, deselecting said same wordline; and (d) repeating steps (a) to (c) until all cells have passed erase verify.

2. A method as in claim 1, in which step (d) comprises repeating steps (b) and (c) on the cells in sequence before repeating step (a).

3. A method as in claim 1, in which step (d) comprises repeating steps (a), (b) and (c) the cells in sequence.

4. A method as in claim 1, in which:

the flash EEPROM comprises memory elements which can be set to deselect the wordlines respectively; and step (c) comprises setting a memory element for said same wordline.

5. A method as in claim 1, in which:

the wordlines are divided into groups;

the flash EEPROM further comprises memory elements which can be set to deselect the wordlines of the groups respectively; and step (c) comprises setting a memory element for a group which includes said same wordline.

6. A flash Electrically-Erasable Programmable Read-Only Memory (EEPROM), comprising:

a plurality of floating gate transistor memory cells;

a plurality of wordlines connected to the cells;

a power supply for generating erase pulses; and a controller for performing the steps of:

(a) controlling the power supply to apply an erase pulse to all wordlines that are not deselected;

(b) erase verifying a next cell;

(c) if said next cell and all other cells connected to a same wordline as said next cell have passed erase verify, deselecting said same wordline; and (d) repeating steps (a) to (c) until all cells have passed erase verify.

7. A flash EEPROM as in claim 6, in which the controller is configured such that step (d) comprises repeating steps (b) and (c) on the cells in sequence before repeating step (a).

8. A flash EEPROM as in claim 6, in which the controller is configured such that step (d) comprises repeating steps (a), (b) and (c) the cells in sequence.

9. A flash EEPROM as in claim 6, in which:

the flash EEPROM comprise memory elements which can be set to deselect the wordlines respectively; and the controller is configured such that step (c) comprises setting a memory element for said same wordline.

10. A flash EEPROM as in claim 9, in which each memory element comprises a memory latch which the controller is configured to set to a first state to select a wordline and to a second state to deselect a wordline.

11. A flash EEPROM as in claim 10, further comprising drivers for the wordlines respectively, the drivers having inputs connected to outputs of the memory latches.

12. A flash EEPROM as in claim 11, in which the drivers comprise driver latches which are set by the memory latches to a first state to select a wordline and to a second state to deselect a wordline.

13. A flash EEPROM as in claim 12, in which:

the controller is configured such that step (a) comprises the substeps of:

(a1) controlling the power supply to apply logic voltages to the drivers such that the driver latches are set to the first or second states in accordance with the outputs of the memory latches; and (a2) controlling the power supply to apply erase voltages which are different from the logic voltages to the drivers such that driver latches which are set to the first state apply erase pulses to the respective wordlines and driver latches which are set to the second state do not apply erase pulses to the respective wordlines.

14. A flash EEPROM as in claim 13, in which:

one of the erase voltages is a negative voltage; and the driver latches which are in the second state apply the negative voltage to the respective wordlines.

15. A flash EEPROM as in claim 6, in which:

the wordlines are divided into groups;

the flash EEPROM further comprises memory elements which can be set to deselect the wordlines of the groups respectively; and the controller is configured such that step (c) comprises setting a memory element for a group that includes said same wordline.

16. A flash EEPROM as in claim 15, in which each memory element comprises a memory latch which the controller is configured to set to a first state to select the wordlines of the respective group and to a second state to deselect the wordlines of the respective group.

17. A flash EEPROM as in claim 16, further comprising drivers for the wordlines respectively, the drivers of each group having inputs connected to an output of the memory latch of the respective group.

18. A flash EEPROM as in claim 17, in which the drivers comprise driver latches which are set by the memory latches to a first state to select a wordline and to a second state to deselect a wordline.

19. A flash EEPROM as in claim 18, in which:

the controller is configured such that step (a) comprises the substeps of:

(a1) controlling the power supply to apply logic voltages to the drivers such that the driver latches are set to the first or second states in accordance with the outputs of the memory latches; and (a2) controlling the power supply to apply erase voltages which are different from the logic voltages to the drivers such that driver latches which are set to the first state apply erase pulses to the respective wordlines and driver latches which are set to the second states do not apply erase pulses to the respective wordlines.

20. A flash EEPROM as in claim 19, in which:

one of the erase voltages is a negative voltage; and the driver latches which are in the second state apply the negative voltage to the wordlines.

* * * * *